(12) United States Patent
Webster et al.

(10) Patent No.: US 9,299,732 B2
(45) Date of Patent: Mar. 29, 2016

(54) STACKED CHIP SPAD IMAGE SENSOR

(71) Applicant: OMNIVISION TECHNOLOGIES, INC., Santa Clara, CA (US)

(72) Inventors: Eric A. G. Webster, Mountain View, CA (US); Tiejun Dai, Santa Clara, CA (US)

(73) Assignee: OmniVision Technologies, Inc., Santa Clara, CA (US)

(*) Notice: Subject to any disclaimer, the term of this patent is extended or adjusted under 35 U.S.C. 154(b) by 103 days.

(21) Appl. No.: 14/065,275

(22) Filed: Oct. 28, 2013

(65) Prior Publication Data

US 2015/0115131 A1 Apr. 30, 2015

(51) Int. Cl.
*H01J 40/14* (2006.01)
*H01L 27/146* (2006.01)

(52) U.S. Cl.
CPC .... *H01L 27/14603* (2013.01); *H01L 27/14643* (2013.01)

(58) Field of Classification Search
CPC .................................................. H01L 25/043
USPC ......................................... 250/208.1, 214 R
See application file for complete search history.

(56) References Cited

U.S. PATENT DOCUMENTS

| | | | |
|---|---|---|---|
| 8,860,850 B1* | 10/2014 | Koenck et al. | 348/241 |
| 2008/0083959 A1* | 4/2008 | Wu et al. | 257/416 |
| 2011/0050969 A1* | 3/2011 | Nishihara | 348/296 |
| 2011/0101481 A1* | 5/2011 | Nozaki | 257/432 |
| 2011/0248396 A1* | 10/2011 | Liu et al. | 257/686 |
| 2012/0326009 A1* | 12/2012 | Salsman | H01L 27/14625 250/208.1 |
| 2013/0032713 A1* | 2/2013 | Barbi et al. | 250/307 |
| 2013/0056866 A1* | 3/2013 | Samoilov et al. | 257/737 |
| 2014/0291486 A1* | 10/2014 | Nagano et al. | 250/208.2 |

FOREIGN PATENT DOCUMENTS

WO    WO 2013058001 A1 * 4/2013

* cited by examiner

*Primary Examiner* — Thanh Luu
(74) *Attorney, Agent, or Firm* — Blakely Sokoloff Taylor & Zafman LLP

(57) ABSTRACT

An example imaging sensor system includes a Single-Photon Avalanche Diode (SPAD) imaging array formed in a first semiconductor layer of a first wafer. The SPAD imaging array includes an N number of pixels, each including a SPAD region formed in a front side of the first semiconductor layer. The first wafer is bonded to a second wafer at a bonding interface between a first interconnect layer of the first wafer and the second interconnect layer of the second wafer. An N number of digital counters are formed in a second semiconductor layer of the second wafer. Each of the digital counters are configured to count output pulses generated by a respective SPAD region.

20 Claims, 8 Drawing Sheets

STACKED CHIP SPAD IMAGE SENSOR

TECHNICAL FIELD

This application relates to image sensors, more specifically single-photon avalanche diode image sensors.

BACKGROUND INFORMATION

Image sensors have become ubiquitous. They are widely used in digital still cameras, cellular phones, security cameras, as well as, medical, automobile, and other applications. The technology used to manufacture image sensors, has continued to advance at great pace. For example, the demands of higher resolution and lower power consumption have encouraged the further miniaturization and integration of these image sensors.

One type of photodetector that may be used in an image sensor or in a light detector is a single-photon avalanche diode (SPAD). A SPAD (also referred to as a Geiger-mode avalanche photodiode (G-APD)) is a solid-state photodetector capable of detecting a low intensity signal, such as low as a single photon. SPAD imaging sensors are semiconductor photosensitive devices made up of an array of SPAD regions that are fabricated on a silicon substrate. The SPAD regions produce an output pulse when struck by a photon. The SPAD regions have a p-n junction that is reverse biased above the breakdown voltage such that a single photo-generated carrier can trigger an avalanche multiplication process that causes current at the output of the photon detection cell to reach its final value quickly. This avalanche current continues until a quenching element is used to quench the avalanche process by reducing the bias voltage. The intensity of the photon signal received by the image sensor is obtained by counting the number of these output pulses within a window of time. Thus, one or more counters may be included in the readout circuitry of the imaging sensor.

However, conventional SPAD imaging sensors have a limited fill-factor because the counters occupy valuable space on the semiconductor substrate. Furthermore, formation of SPADs in a traditional CMOS process results in undesirable trade-offs having to be made between SPAD performance and transistor performance.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of a Stacked Chip SPAD Image Sensor are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. Directional terminology such as "top", "down", "above", "below" are used with reference to the orientation of the figure(s) being described.

Figure 1:
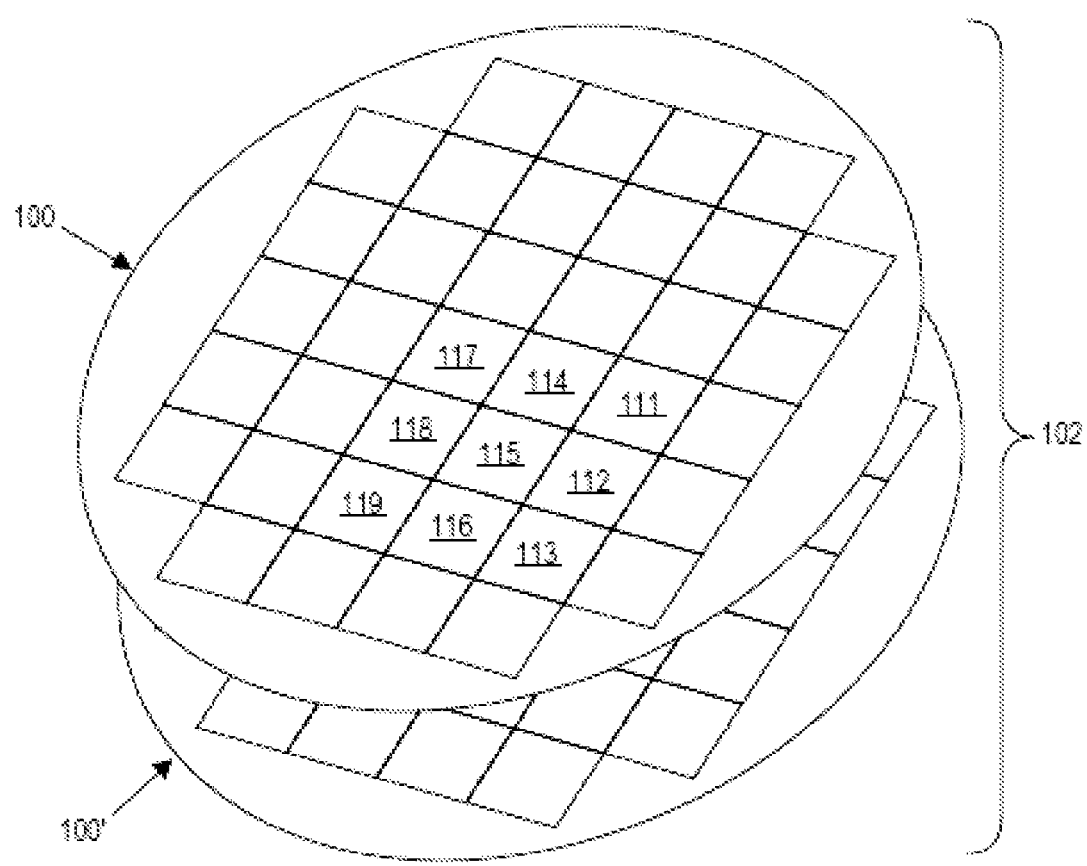
FIG. 1 is an exploded view of stacked semiconductor wafers with integrated circuit dies, in accordance with an embodiment of the invention.

FIG. 1 is an exploded view of stacked device wafers 100 and 100' that are to be bonded together to form an integrated circuit system 102, in accordance with an embodiment of the invention. Device wafers 100 and 100' may include silicon, gallium arsenide, or other semiconductor materials. In the illustrated example, device wafer 100 includes semiconductor dies 111-119 while device wafer 100' includes corresponding semiconductor dies (view obscured in FIG. 1). As will be discussed in more detail below, in some embodiments, each die 111-119 of device wafer 100 may include an array of Single-Photon Avalanche Diodes (SPADs), while each corresponding die of device wafer 100' includes an array of digital counters and associated read-out electronics. The placement of digital counters on the bottom device wafer 100' allows for a very high fill factor in the SPAD array on the top device wafer 100. Furthermore, since device wafer 100 is formed separately from device wafer 100', custom fabrication processes may be utilized to optimize the formation of the SPAD array on device wafer 100, while traditional CMOS processes may be retained when forming the CMOS circuitry on the device wafer 100'.

Figure 2A:
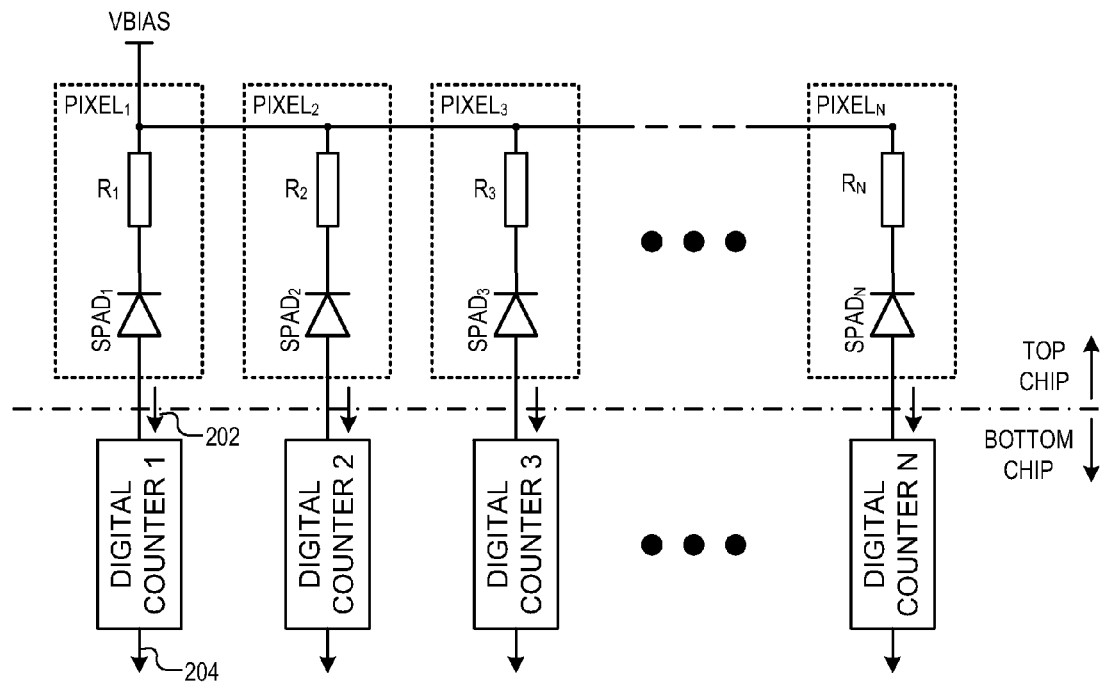
FIG. 2A is a circuit diagram illustrating a stacked chip single-photon avalanche diode (SPAD) image sensor having an example passive quench circuit in the top chip, in accordance with an embodiment of the invention.

FIG. 2A is a circuit diagram illustrating a stacked chip single-photon avalanche diode (SPAD) image sensor having a passive quench circuit in the top chip. The pixel circuitry illustrated in FIG. 2A (e.g., PIXEL$_1$, PIXEL$_2$, etc.) is one possible pixel circuitry architecture for implementing each pixel with an imaging array, such as imaging array 605, which will be discussed in more detail below. In FIG. 2A, the pixels $PIXEL_1$ through $PIXEL_N$ are arranged in a single row. However, in other embodiments pixels of an imaging array may be arranged into a single column, or into a two-dimensional array of columns and rows. Each illustrated example of a pixel includes a single-photon avalanche diode (SPAD) and a passive quenching element (e.g., resistors $R_1$-$R_N$) disposed on a top chip of a stacked chip system. As shown, there are N number of SPADs, N number of passive quenching elements, and an N number of digital counters (e.g., Digital Counters 1-N). The digital counters are disposed on a bottom chip of the stacked chip system and are electrically coupled to receive output pulses 202 generated by a respective SPAD in response to a received photon. The digital counters may be enabled to count the number of output pulses 202 during a window of time and to output a digital signal 204 that is representative of the count. Although, FIG. 2A illustrates a direct connection between the pixel circuitry and the digital counter, any connection between pixel circuitry and the digital counter, including by way of AC coupling, may be utilized in accordance with the present teachings. Furthermore, any known SPAD bias polarity and/or orientation may be implemented. In one embodiment, each digital counter includes an amplifier to amplify the received output pulse 202. In one embodiment, each digital counter is a 20-bit digital counter.

In operation, the SPAD is reverse biased via a bias voltage VBIAS that is above the breakdown voltage of the SPAD. In response to a single photo-generated carrier, an avalanche multiplication process is triggered that causes an avalanche current at the output of the SPAD. This avalanche current self-quenches in response to a voltage drop that is developed across the quenching element (e.g., $R_1$), which causes the bias voltage across the SPAD to drop. After the quenching of the avalanche current the voltage across the SPAD recovers to above the bias voltage and then the SPAD is ready to be triggered again. The resulting output pulse 202 of the SPAD is received by a digital counter which increments its count in response thereto.

Figure 2B:
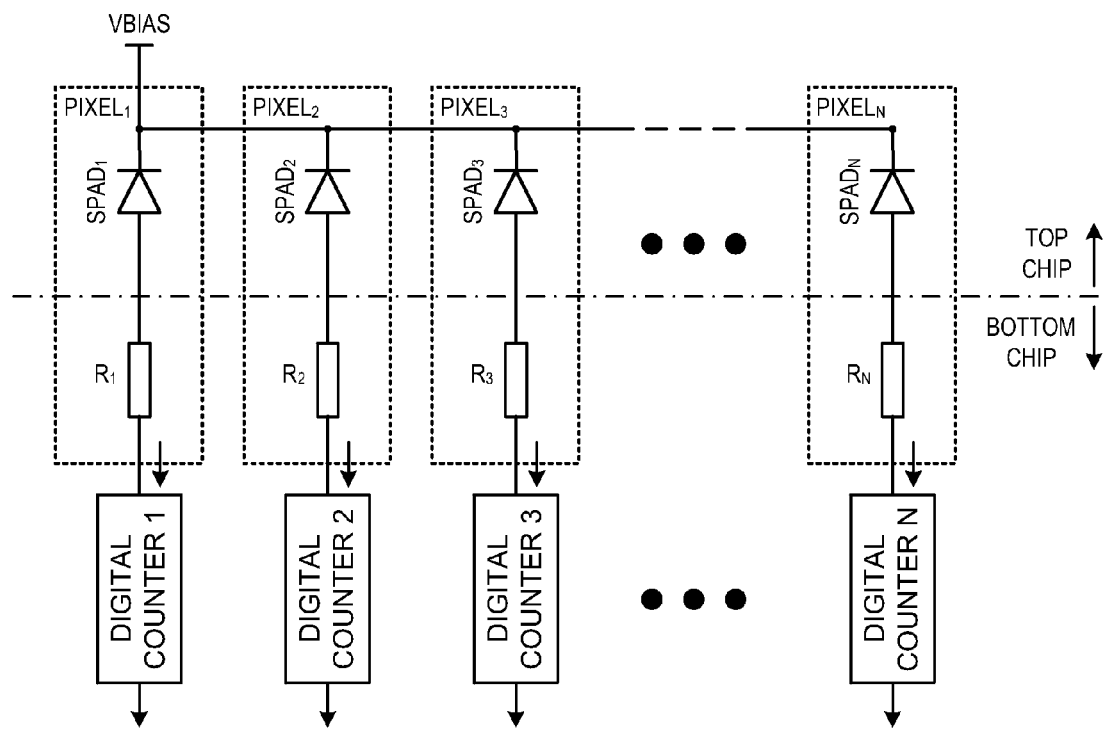
FIG. 2B is a circuit diagram illustrating a stacked chip SPAD image sensor having an example passive quench circuit in the bottom chip, in accordance with an embodiment of the invention.

FIG. 2B is a circuit diagram illustrating a stacked chip SPAD image sensor having a passive quench circuit in the bottom chip. The pixel circuitry illustrated in FIG. 2B (e.g., $PIXEL_1$, $PIXEL_2$, etc.) is one possible pixel circuitry architecture for implementing each pixel with an imaging array, in accordance with embodiments of the present invention. The pixel circuitry of FIG. 2B is similar in structure and operation to the pixel circuitry of FIG. 2A, described above, except the passive quenching elements (e.g., $R_1$-$R_N$) are formed on the bottom chip.

Figure 2C:
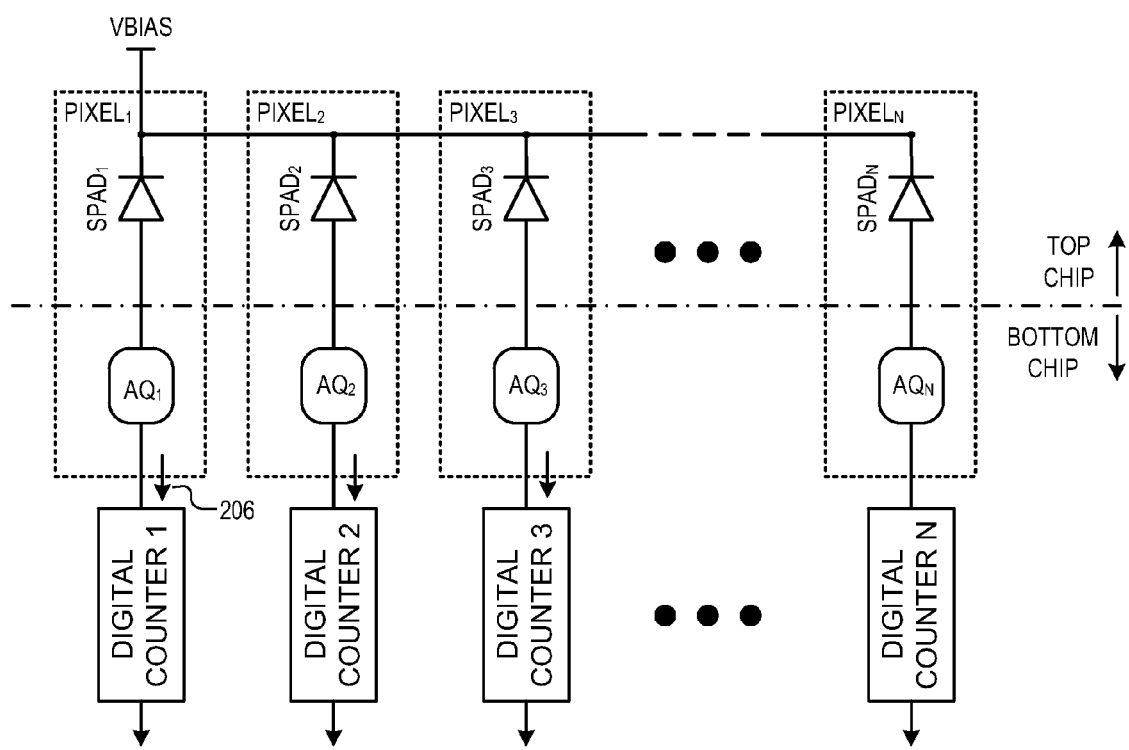
FIG. 2C is a circuit diagram illustrating a stacked chip SPAD image sensor having an active quench circuit in the bottom chip, in accordance with an embodiment of the invention.

FIG. 2C is a circuit diagram illustrating a stacked chip SPAD image sensor having an active quench circuit in the bottom chip. The pixel circuitry illustrated in FIG. 2C (e.g., $PIXEL_1$, $PIXEL_2$, etc.) is one possible pixel circuitry architecture for implementing each pixel with an imaging array, in accordance with embodiments of the present invention. In FIG. 2C, each illustrated example of a pixel includes a single-photon avalanche diode (SPAD) and an active quenching element (e.g., $AQ_1$-$AQ_N$). As shown, there are N number of SPADs, N number of active quenching elements, and an N number of digital counters (e.g., Digital Counters 1-N).

In operation, the SPAD is reverse biased via a bias voltage VBIAS that is above the breakdown voltage of the SPAD. In response to a single photo-generated carrier, an avalanche multiplication process is triggered that causes an avalanche current at the output of the SPAD. The active quench circuit then senses this steep onset of avalanche current, generates a digital output pulse 206, quickly reduces the bias voltage across the SPAD to below the breakdown voltage to quench the avalanche current, and then returns the bias voltage to above the breakdown voltage. The digital output pulse 206 is received by a digital counter which increments its count in response thereto.

Conventional SPAD designs that incorporated active quench circuits suffered from reduced fill factor on the imaging plane due to the area occupied by the active quench circuits themselves. Accordingly, one advantage of implementing a stacked chip structure, as disclosed herein, is that an active quench circuit can be formed on a separate chip and thus not reduce the fill factor of the SPAD imaging array on the top chip.

It is noted that the circuit diagrams of FIGS. 2A-2C are purely for illustrative purposes and that some circuit elements (e.g., passive components such as resistors and capacitors, and active components such as transistors) may have been omitted so as not to obscure the relevant teachings. For example, the illustrated pixel circuitry of FIGS. 2A-2C may produce an output pulse that requires amplification prior to being sensed by the input of the digital counters. In another example, connection to the node between R1 and SPAD1 of FIGS. 2A and 2C would be at a high voltage that may require AC coupling.

Figure 3A:
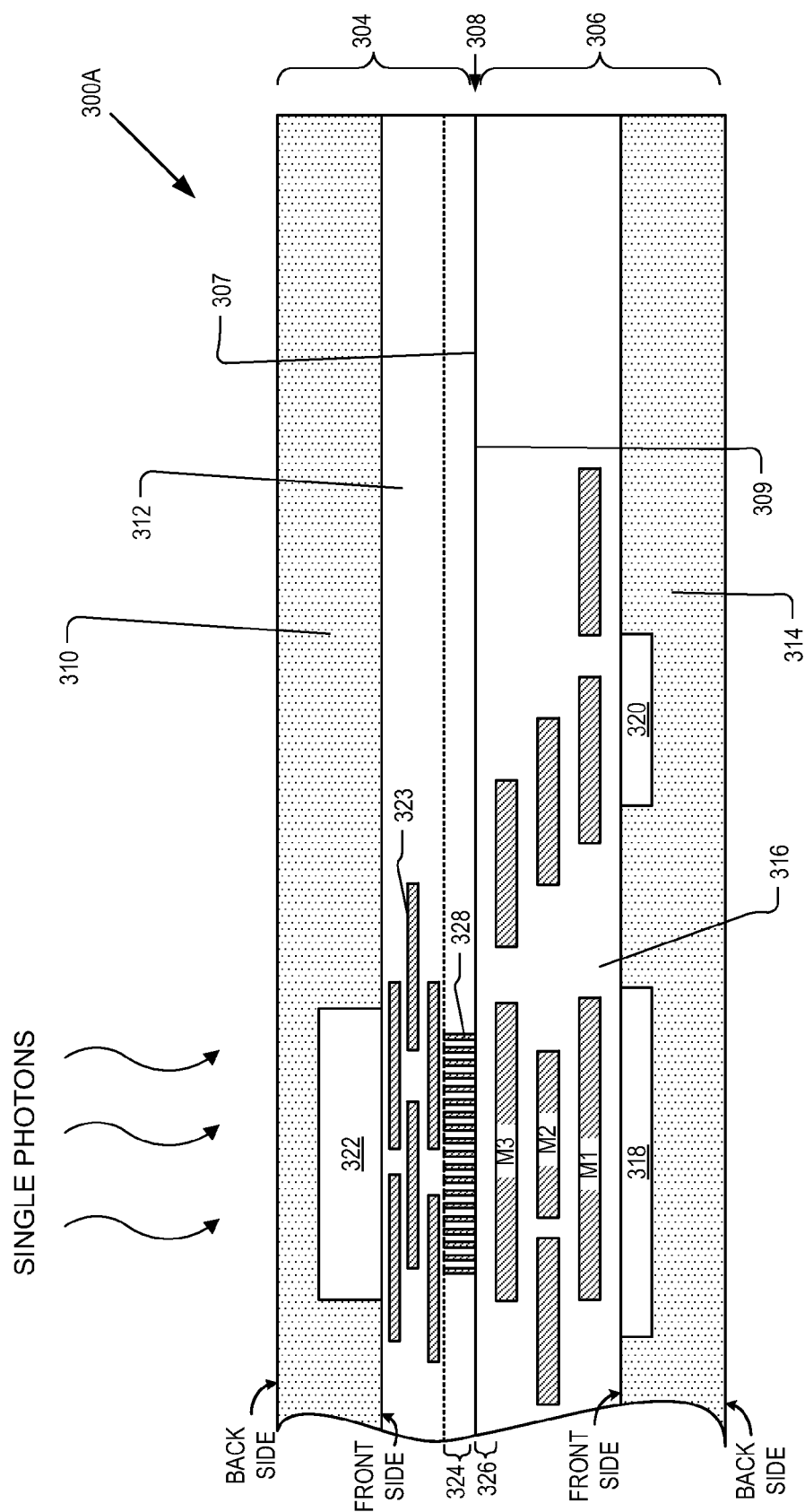
FIG. 3A is a cross-sectional view of an integrated circuit system having stacked device wafers, in accordance with an embodiment of the invention.

FIG. 3A is a cross-sectional view of an integrated circuit system 300A having stacked device wafers 304 and 306, in accordance with an embodiment of the invention. Integrated circuit system 300A is one possible implementation of a portion of integrated circuit system 102 of FIG. 1. The illustrated example of integrated circuit system 300A includes a first device wafer 304, a second device wafer 306, and a bonding interface 308. The first device wafer 304 includes a first semiconductor layer 310 and a first interconnect layer 312, while the second device wafer 306 is shown as including a second semiconductor layer 314 and a second interconnect layer 316. Semiconductor layer 310 is shown as including semiconductor device 322 and interconnect layer 312 is shown as including metal layers 323, oxide layer 324, and vias 328. Semiconductor layer 314 is shown as including semiconductor devices 318 and 320, while interconnect layer 316 is shown as including metal layers M1, M2, and M3, and dielectric layer 326.

In one embodiment, either or both of semiconductor layer 310 and semiconductor layer 314 are layers of epitaxially grown silicon. As shown, semiconductor layer 314 includes semiconductor devices 318 and 320 formed in a front side of the semiconductor layer 314, while semiconductor layer 310 includes device 322 formed in a front side of semiconductor layer 310. In one embodiment, as will be discussed in more detail below, semiconductor device 322 includes a SPAD imaging array. Continuing with this example, the SPAD imaging array may include pixels arranged into several rows and several columns. Each pixel of the SPAD array may include a SPAD region formed in the front side and configured to receive photons from the backside of semiconductor layer 310. Device 318 may include an array of digital counters. In one example, device 318 includes, at least, one digital counter for each SPAD region included in the SPAD imaging array. Device 320 may include associated peripheral circuitry, such as a readout circuit, a control circuit, or other function circuitry of an image sensor. In one embodiment, device 318 further includes a storage device, such as random access memory, to act as a frame store to enable high-speed burst imaging capability.

Thus, device wafers 304 and 306 may be bonded together to form an integrated circuit system, such as an imaging sensor system that includes devices on the first device wafer 304 as well as devices on the second device wafer 306. As will be shown below, devices 318, 320, and 322 may be formed in their respective semiconductor layer prior to bonding the device wafers 304 and 306 together. In one embodiment, one or both of front side 307 and front side 309 are flattened by a chemical mechanical polish. In one embodiment dielectric layer 326 and interconnect layer 312 each include an oxide that are bonded together to form bonding interface 308.

Figure 3B:
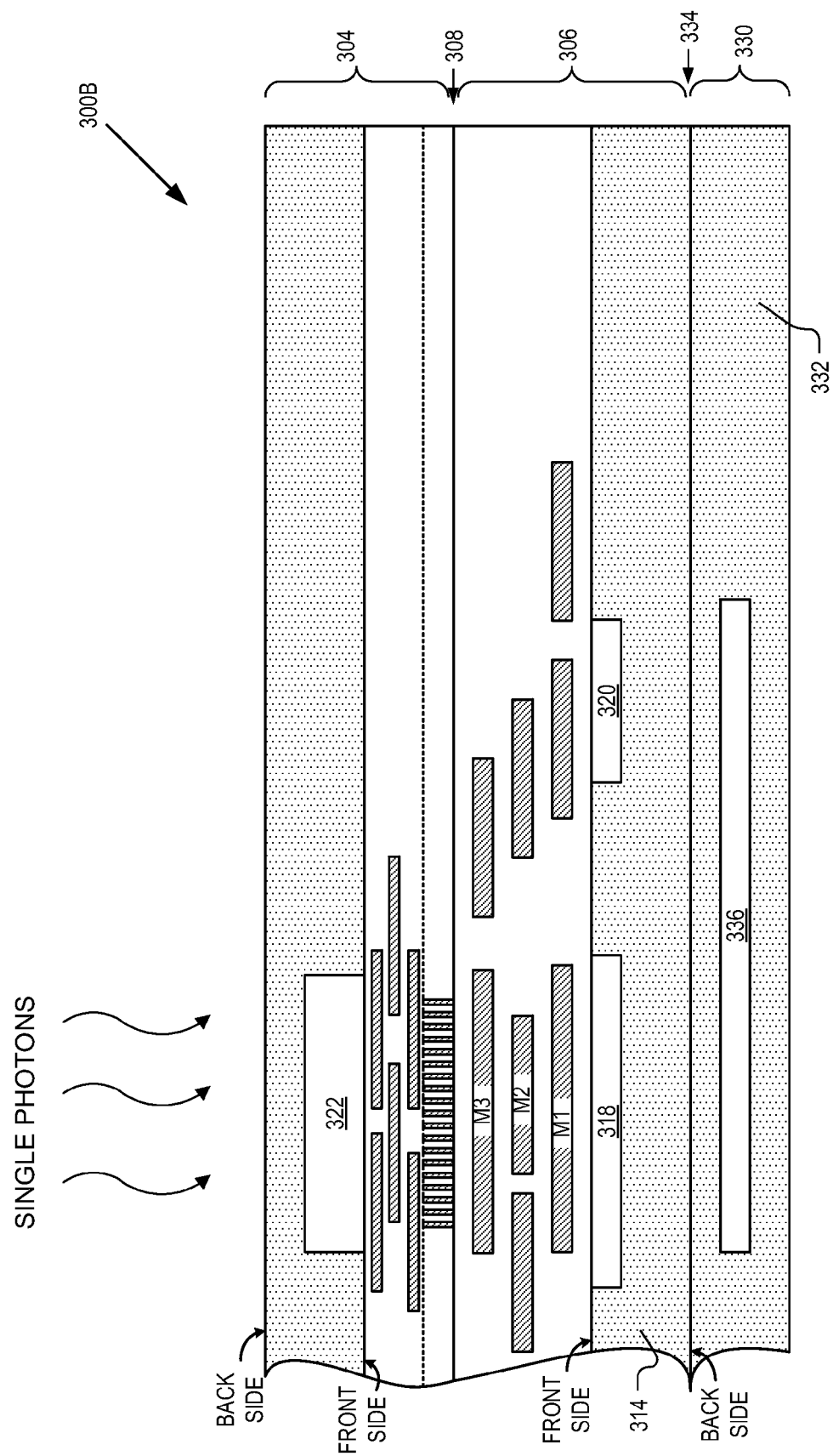
FIG. 3B is a cross-sectional view of an integrated circuit system having three stacked device wafers, in accordance with an embodiment of the invention.

FIG. 3B is a cross-sectional view of an integrated circuit system 300B having stacked device wafers 304, 306, and 330, in accordance with an embodiment of the invention. Integrated circuit system 300B is one possible implementation of a portion of integrated circuit system 102 of FIG. 1. The illustrated example of integrated circuit system 300B includes first device wafer 304, second device wafer 306, third device wafer 330 and bonding interfaces 308 and 334. First device wafer 304 and second device wafer 306 bond and operate as discussed above. However, integrated circuit system 300B includes an additional third wafer 330 bonded to the second device wafer 306. As shown, third wafer 330 includes a third semiconductor layer 332 and semiconductor device 336 formed in or on the third device wafer 330. In one embodiment, device 336 includes a storage device, such as random access memory (RAM), to act as a frame store to enable high-speed burst imaging capability. In this embodiment, device 336 may be coupled to receive and store the outputs of the digital counters included in device 318.

Figure 4:
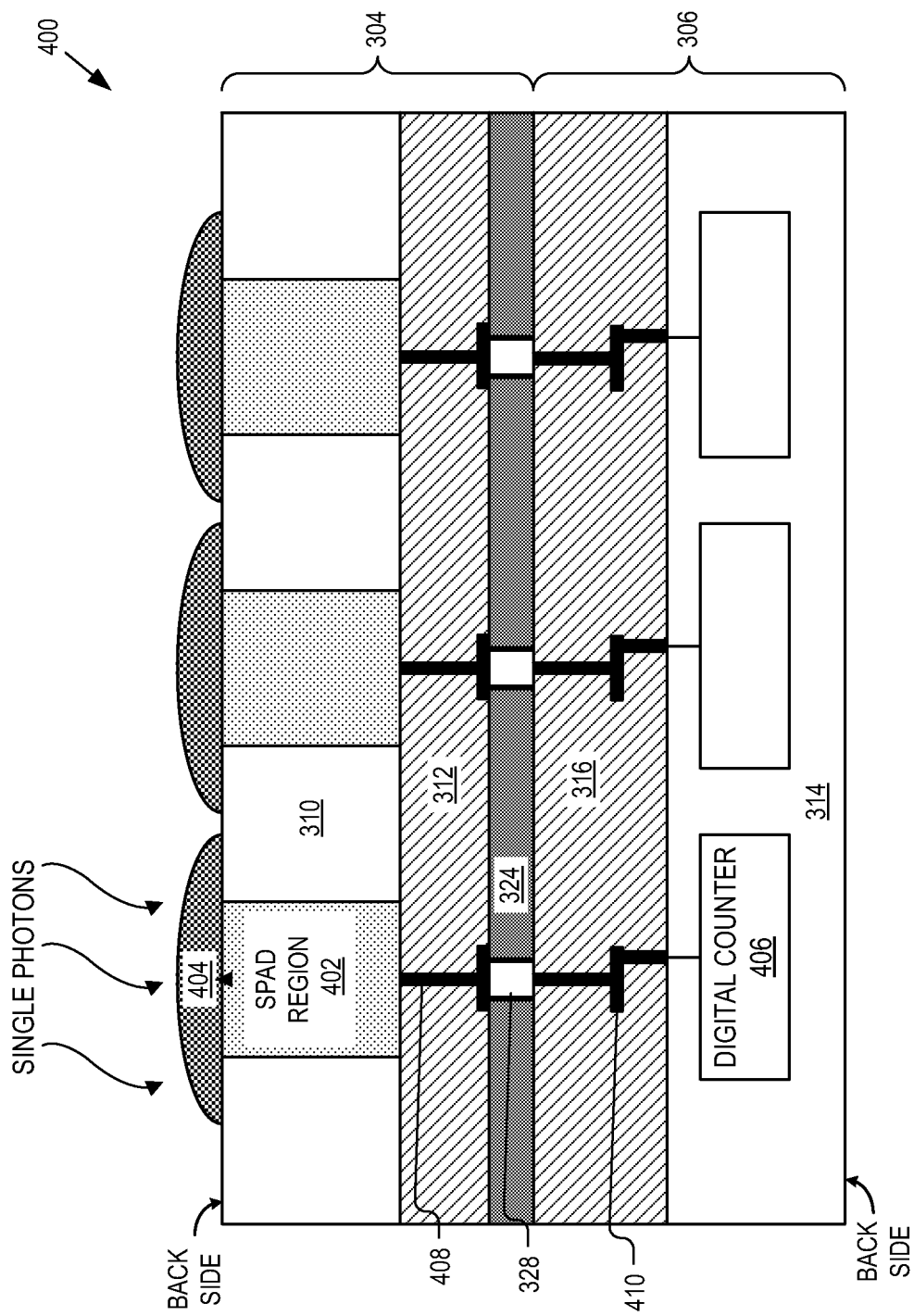
FIG. 4 is a cross-sectional view of an integrated circuit system showing further detail of a SPAD imaging array with microlenses, in accordance with an embodiment of the invention.

FIG. 4 is a cross-sectional view of an integrated circuit system 400 showing further detail of a SPAD imaging array with microlenses 404, in accordance with an embodiment of the invention. As shown in FIG. 4, system 400 includes SPAD regions 402 formed in semiconductor layer 310. SPAD regions 402 may be one implementation of SPAD imaging array 322 of FIG. 3. SPAD regions 402 may include any known SPAD design, including a guard-ring design.

Also shown in FIG. 4, are digital counters 406 formed in semiconductor layer 314. Digital counters 406 are one possible implementation of the digital counters included in device 318 of FIG. 3. FIG. 4 further illustrates that system 400 includes at least one digital counter 406 for each SPAD region 402. As mentioned above, having a separate digital counter 406 for each SPAD region allows for fast and simultaneous read-out of the SPAD regions 402, allowing for a global shutter operation of the imaging sensor. Furthermore, formation of the digital counters 406 on a separate wafer allow for a substantial increase in the fill factor of the SPAD imaging array. Fill factor may refer to the ratio of the total area occupied by just the SPAD regions 402 to the total contiguous area occupied by the SPAD regions. In one embodiment, the fill factor of the SPAD imaging array of FIG. 4 is very close to 100% in the 10 μm pixel pitch range.

SPAD region 402 is coupled to digital counter 406 by way of metal traces 408 and 410, and via 328. In one embodiment, vias 328 are micro-through silicon vias (μTSVs). The μTSVs 328 may include a conductive material (e.g., copper, polysilicon, etc.) deposited therein. Furthermore, μTSVs 328 may have an approximate diameter of less than about ten (10) micrometers, or in one embodiment, less than about five (5) micrometers. As shown, system 400 may include at least one via 328 for each SPAD region 402 to transfer output pulses generated by the SPAD region to the interconnect layer 316 of wafer 306.

Metal traces 408 and 410 may include a redistribution layer (RDL) comprising a thin-film (e.g., aluminum, copper, etc.) for rerouting and redistributing electrical connections between SPAD regions 402 and digital counters 406.

The integrated circuit system 400 of FIG. 4 further includes several microlenses 404. In one embodiment, system 400 includes one microlens 404 for each SPAD region 402. Microlens 404 is configured to direct (i.e., focus) incident photons onto SPAD region 402.

Figure 5:
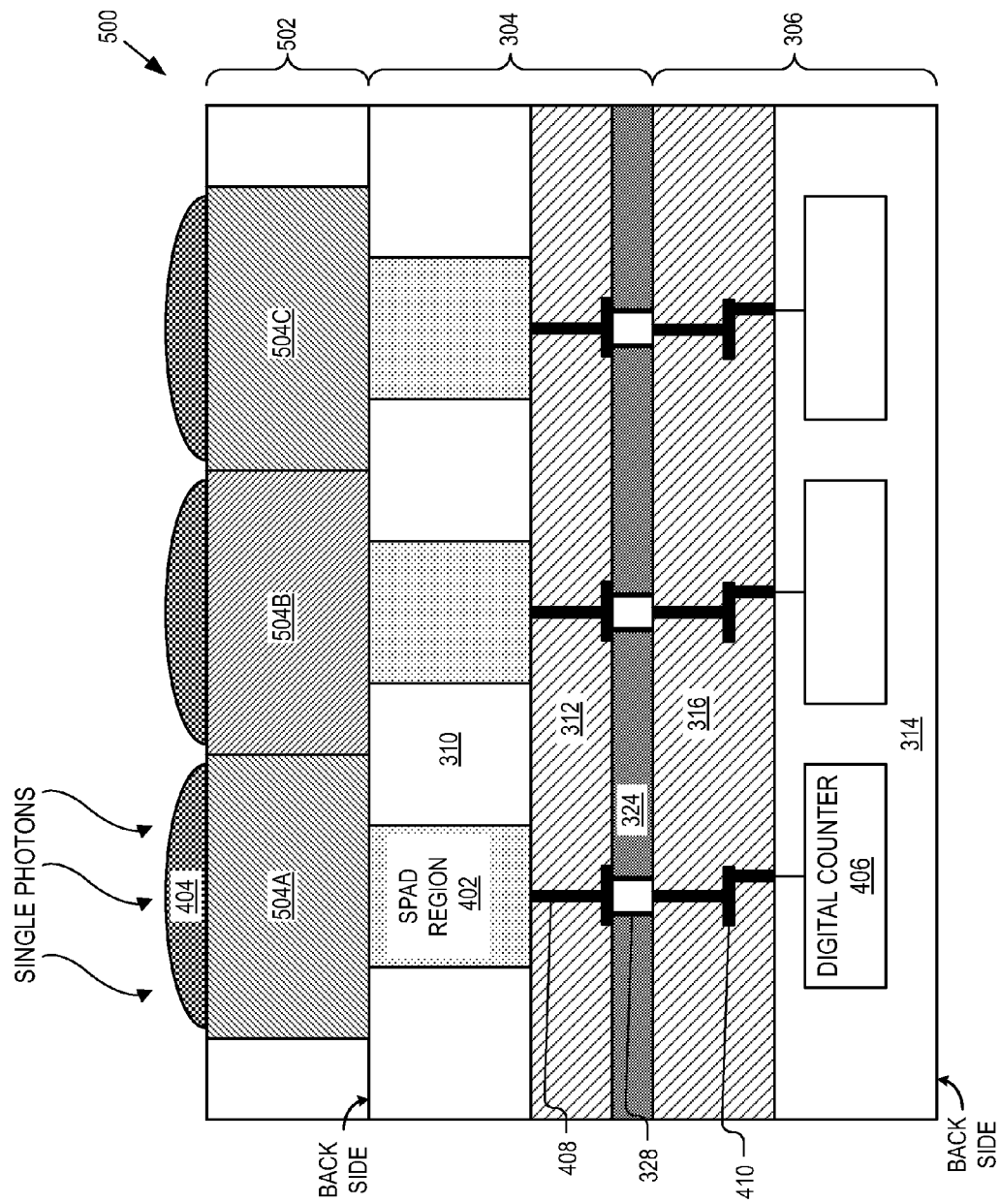
FIG. 5 is a cross-sectional view of an integrated circuit system showing further detail of a SPAD imaging array with a color filter layer and microlenses, in accordance with an embodiment of the invention.

FIG. 5 is a cross-sectional view of an integrated circuit system 500 showing further detail of a SPAD imaging array with a color filter layer 502 and microlenses 402, in accordance with an embodiment of the invention. In the embodiment of FIG. 5, color filter layer 502 is disposed on the backside of semiconductor layer 310 to filter light received by system 500. In one embodiment, color filter layer 502 includes at least one color filter (e.g., 504A, 504B, and 504C) for each SPAD region 402. A color filter may be configured to only allow light of a certain wavelength to pass through the color filter along to SPAD region 402. For example, color filter 504A may be configured to allow blue light onto SPAD region 402, while blocking red and green light. Similarly, color filter 504B may be configured to allow green light to pass through, while filtering out blue and red light. Continuing with this example, color filter 504C may be configured to allow red light to pass, while filtering out blue and green light.

As shown in FIG. 5, system 500 includes microlenses 402 disposed on the color filter array 502 to direct incident photons through the color filter layer 502 to a respective SPAD region 402.

Figure 6:
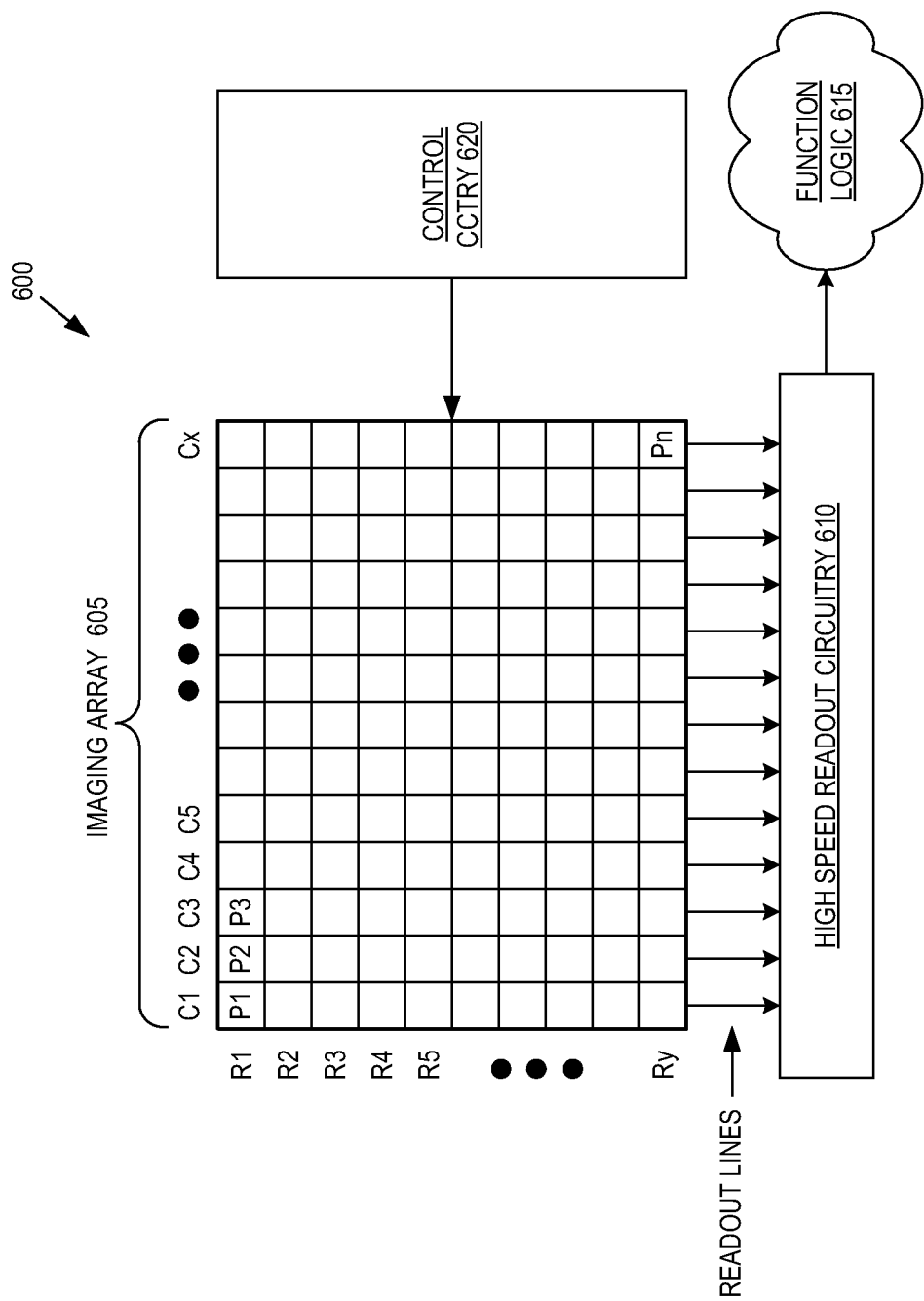
FIG. 6 is a functional block diagram illustrating an embodiment of a SPAD imaging sensor, in accordance with an embodiment of the invention.

FIG. 6 is a functional block diagram illustrating an embodiment of a SPAD imaging sensor 600, in accordance with an embodiment of the invention. SPAD imaging sensor 600 may be one implementation of at least one of the semiconductor devices mentioned previously, including devices 300, 400, and 500, discussed above. The illustrated embodiment of image sensor 600 includes a SPAD imaging array 605, high speed readout circuitry 610, function logic 615, and control circuitry 620.

Imaging array 605 is a two-dimensional ("2D") array of backside illuminated imaging sensors or pixels (e.g., pixels P1, P2 . . . , Pn). In one embodiment, each pixel includes a single-photon avalanche diode (SPAD). As illustrated, each pixel is arranged into a row (e.g., rows R1 to Ry) and a column (e.g., column C1 to Cx) to acquire image data of a person, place, or object, which can then be used to render a 2D image of the person, place, or object.

Output pulses generated by the SPAD regions are read out by high speed readout circuitry 610 and transferred to function logic 615. Readout circuitry 610 includes at least one digital counter for each of the SPAD regions and can also include amplification circuitry and/or quenching circuitry. Function logic 615 can simply store image data in memory or even manipulate the image data by applying post image effects (e.g., crop, rotate, remove red eye, adjust brightness, adjust contrast, or otherwise). Control circuitry 620 is coupled to imaging array 605 and/or to readout circuitry 610 to control operational characteristics of imaging array 605. For example, control circuitry 620 may simultaneously enable each of the digital counters included in high speed readout circuitry 610 for a window of time so as to implement a global shutter operation. Accordingly, embodiments of the SPAD stacked chip image sensor, discussed herein, provide for imaging that is both high speed and low light sensitive, which is typically not achieved with conventional sensor architectures.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An imaging sensor system, comprising:
a first semiconductor layer of a first wafer;
a Single-Photon Avalanche Diode (SPAD) imaging array formed in the first semiconductor layer, wherein the SPAD imaging array includes an N number of pixels, each pixel including a SPAD region formed in a front side of the first semiconductor layer, and wherein each SPAD region is configured to receive photons from a backside of the first semiconductor layer;
a color filter layer disposed on the backside of the first semiconductor layer;
a first interconnect layer disposed on the front side of the first semiconductor layer;
a second semiconductor layer of a second wafer;
a second interconnect layer disposed on the second semiconductor layer, wherein the first wafer is bonded to the second wafer at a bonding interface between the first interconnect layer and the second interconnect layer;
at least N number of quenching elements formed in the second semiconductor layer, wherein each of the quenching elements is coupled to quench avalanching of a respective SPAD region by lowering a bias voltage; and
a plurality of digital counters formed in the second semiconductor layer and electrically coupled to the SPAD imaging array by way of the first and second interconnect layers, wherein the plurality of digital counters includes at least N number of digital counters, wherein each of the N number of digital counters are configured to count output pulses generated by a respective SPAD region.

2. The imaging sensor system of claim 1, wherein the first interconnect layer comprises at least N number of vias, wherein each of the N number of vias are coupled to a respective pixel of the SPAD imaging array to transfer the output pulses to the second interconnect layer at the bonding interface.

3. The imaging sensor system of claim 2, wherein the vias are micro through silicon vias (μTSV).

4. The imaging sensor system of claim 1, wherein each quenching element is a passive quenching element comprising a resistor.

5. The imaging sensor system of claim 1, wherein each quenching element is an active quenching element.

6. The imaging sensor system of claim 1, further comprising random access memory formed in the second semiconductor layer and coupled to store an output of the plurality of digital counters.

7. The imaging sensor system of claim 1, wherein the first interconnect layer includes a first oxide, the second interconnect layer includes a second oxide, and wherein the bonding interface includes an interface between the first oxide and the second oxide.

8. The imaging sensor system of claim 1, further comprising at least N number of microlenses, wherein each microlens is disposed to direct incident photons through the color filter layer to a respective SPAD region.

9. The imaging sensor system of claim 1, further comprising a control circuit coupled to simultaneously enable each of the N number of digital counters so as to implement a global shutter operation during image acquisition.

10. The imaging sensor of claim 1, further comprising a third semiconductor layer of a third wafer bonded to the second wafer, wherein the third semiconductor includes random access memory (RAM), coupled to store image data generated by the N number of digital counters.

11. An integrated circuit system, comprising:
a first wafer having a plurality of first dies, each first die including:
a Single-Photon Avalanche Photodiode (SPAD) imaging array formed in a first semiconductor layer, wherein the SPAD imaging array includes an N number of pixels, each pixel including a SPAD region formed in a front side of the first semiconductor layer, and wherein each SPAD region is configured to receive photons from a backside of the first semiconductor layer; and,
a color filter layer disposed on the backside of the first semiconductor layer, and
a first interconnect layer disposed on the front side of the first semiconductor layer;
a second wafer having a plurality of second dies, each second die including:
a second interconnect layer disposed on a second semiconductor layer, wherein the first wafer is bonded to the second wafer at a bonding interface between the first interconnect layer and the second interconnect layer,
at least N number of quenching elements formed in the second semiconductor layer, wherein each of the quenching elements are coupled to quench avalanching of a respective SPAD region by lowering a bias voltage, and
a plurality of digital counters formed in the second semiconductor layer and electrically coupled to the SPAD imaging array by way of the first and second interconnect layers, wherein the plurality of digital counters includes at least N number of digital counters, wherein each of the N number of digital counters are configured to count output pulses generated by a respective SPAD region.

12. The integrated circuit system of claim 11, wherein the first interconnect layer comprises at least N number of vias, wherein each of the N number of vias are coupled to a respective pixel of the SPAD imaging array to transfer the output pulses to the second interconnect layer at the bonding interface.

13. The integrated circuit system of claim 12, wherein the vias are micro through silicon vias (μTSV).

14. The integrated circuit system of claim 11, wherein each quenching element is a passive quenching element comprising a resistor.

15. The integrated circuit system of claim 11, wherein each quenching element is an active quenching element.

16. The integrated circuit system of claim 11, further comprising random access memory formed in the second semiconductor layer and coupled to store an output of the plurality of digital counters.

17. The integrated circuit system of claim 11, wherein the first interconnect layer includes a first oxide, the second interconnect layer includes a second oxide, and wherein the bonding interface includes an interface between the first oxide and the second oxide.

18. The integrated circuit system of claim 11, further comprising at least N number of microlenses, wherein each microlens is disposed to direct incident photons through the color filter layer to a respective SPAD region.

19. The integrated circuit system of claim 11, further comprising a control circuit coupled to simultaneously enable each of the N number of digital counters so as to implement a global shutter operation during image acquisition.

20. The integrated circuit of claim 11, further comprising a third semiconductor layer of a third wafer bonded to the second wafer, wherein the third semiconductor includes random access memory (RAM), coupled to store image data generated by the N number of digital counters.

* * * * *